(12) United States Patent
Chang

(10) Patent No.: US 10,813,247 B2
(45) Date of Patent: Oct. 20, 2020

(54) CIRCUIT BOARD AND HEAT DISSIPATING DEVICE THEREOF

(71) Applicant: ASUSTeK COMPUTER INC., Taipei (TW)

(72) Inventor: Chia-Wei Chang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/423,471

(22) Filed: May 28, 2019

(65) Prior Publication Data

US 2019/0373766 A1 Dec. 5, 2019

(30) Foreign Application Priority Data

Jun. 4, 2018 (TW) .............................. 107207458 A

(51) Int. Cl.
*H05K 7/20* (2006.01)

(52) U.S. Cl.
CPC ..... *H05K 7/20163* (2013.01); *H05K 7/20172* (2013.01); *H05K 7/20409* (2013.01)

(58) Field of Classification Search
None
See application file for complete search history.

(56) References Cited

U.S. PATENT DOCUMENTS

| 6,625,021 | B1 * | 9/2003 | Lofland | H01L 23/4093 |
| | | | | 165/104.33 |
| 6,809,926 | B2 * | 10/2004 | Liu | H01L 23/467 |
| | | | | 165/121 |
| 6,874,566 | B1 * | 4/2005 | Artman | H01L 23/467 |
| | | | | 165/120 |
| 7,573,716 | B2 * | 8/2009 | Sun | H05K 1/0201 |
| | | | | 165/80.3 |
| 7,663,887 | B2 * | 2/2010 | Li | H01L 23/4093 |
| | | | | 165/80.3 |
| 7,874,348 | B2 * | 1/2011 | Liu | H01L 23/427 |
| | | | | 165/104.33 |
| 2003/0159819 | A1 * | 8/2003 | Lee | H01L 23/4006 |
| | | | | 165/185 |
| 2005/0117307 | A1 * | 6/2005 | Tanaka | H01L 23/4006 |
| | | | | 361/719 |

(Continued)

FOREIGN PATENT DOCUMENTS

TW M280096 U 11/2005

*Primary Examiner* — Courtney L Smith
(74) *Attorney, Agent, or Firm* — McClure, Qualey & Rodack, LLP

(57) ABSTRACT

A circuit board and a heat dissipating device are provided. The heat dissipating device is for dissipating heat from a heat element. The heat dissipating device comprises: a base, having a plurality of fixing holes, each of the fixing holes is disposed adjacent to a periphery of the base, each connecting direction is respectively defined according to a connecting line between each of the fixing holes and the adjacent fixing holes; a fin set, disposed on the base and having at least one airflow channel; and a fan assembly, disposed in the fin set to generate an airflow flows through the at least one airflow channel, wherein a vertical projection of the direction of the at least one airflow channel on the base and a vertical projection of the connecting line direction on the base are non-orthogonal and non-parallel.

9 Claims, 7 Drawing Sheets

(56) References Cited

U.S. PATENT DOCUMENTS

| | | | | |
|---|---|---|---|---|
| 2008/0121372 A1* | 5/2008 | Zhou | ............... | H01L 23/4006 |
| | | | | 165/80.3 |
| 2011/0149503 A1* | 6/2011 | Wu | ............... | H01L 23/4006 |
| | | | | 361/679.46 |
| 2013/0083483 A1* | 4/2013 | Wei | ............... | H01L 23/467 |
| | | | | 361/697 |
| 2013/0340989 A1* | 12/2013 | Megarity | ............... | H01L 23/4006 |
| | | | | 165/185 |
| 2017/0135249 A1 | 5/2017 | Jensen | | |

* cited by examiner

CIRCUIT BOARD AND HEAT DISSIPATING DEVICE THEREOF

CROSS-REFERENCE TO RELATED APPLICATION

This application claims the priority benefit of Taiwan application serial No. 107207458, filed on Jun. 4, 2018. The entirety of the above-mentioned patent application is hereby incorporated by reference herein and made a part of specification.

BACKGROUND OF THE INVENTION

Field of the Invention

The invention relates to a circuit board and, more particularly, to a circuit board with a heat dissipating device.

Description of the Related Art

In a general computer host, a processor is mounted on a motherboard, and a heat sink is mounted on the processor. Thus, when the host computer is in operation, the heat generated by the processor is dissipated via the heat sink to avoid a crash or even burn out caused by the too-high temperature of the processor.

Generally, a heat sink of a computer system is adjacent to or close to a heat source, and airflow generated by the heat sink dissipates the heat generated by the heat source. However, when the computer system includes multiple heat sources therein, varies streams of the airflow generated by the heat sinks flow on a same airflow path, where the dissipated hot air is inhaled by other heat sink nearby, resulting in poor heat dissipation of the entire computer system.

BRIEF SUMMARY OF THE INVENTION

According to a first aspect of the disclosure, a heat dissipating device for dissipating heat from a heat element is provided herein. The heat dissipating device comprises: a base, having a plurality of fixing holes, each of the fixing holes is disposed adjacent to a periphery of the base, each connecting direction is respectively defined according to a connecting line between each of the fixing holes and the adjacent fixing holes; a fin set, disposed on the base and having at least one airflow channel; and a fan assembly, disposed in the fin set to generate an airflow flows through the at least one airflow channel, wherein a vertical projection of the direction of the at least one airflow channel on the base and a vertical projection of the connecting line direction on the base are non-orthogonal and non-parallel.

According to a second aspect of the disclosure, a circuit board is provided herein. The circuit board includes: a configuration surface; at least two heat elements, disposed on the configuration surface; and at least two heat dissipating devices, respectively disposed on the at least two heat elements, and respectively having at least one airflow channel, wherein the directions of the at least one airflow channel of each of the at least two heat dissipating devices are misaligned with each other.

These and other features, aspects and advantages of the present invention will become better understood with regard to the following description, appended claims, and accompanying drawings.

DETAILED DESCRIPTION OF THE EMBODIMENTS

Figure 1:
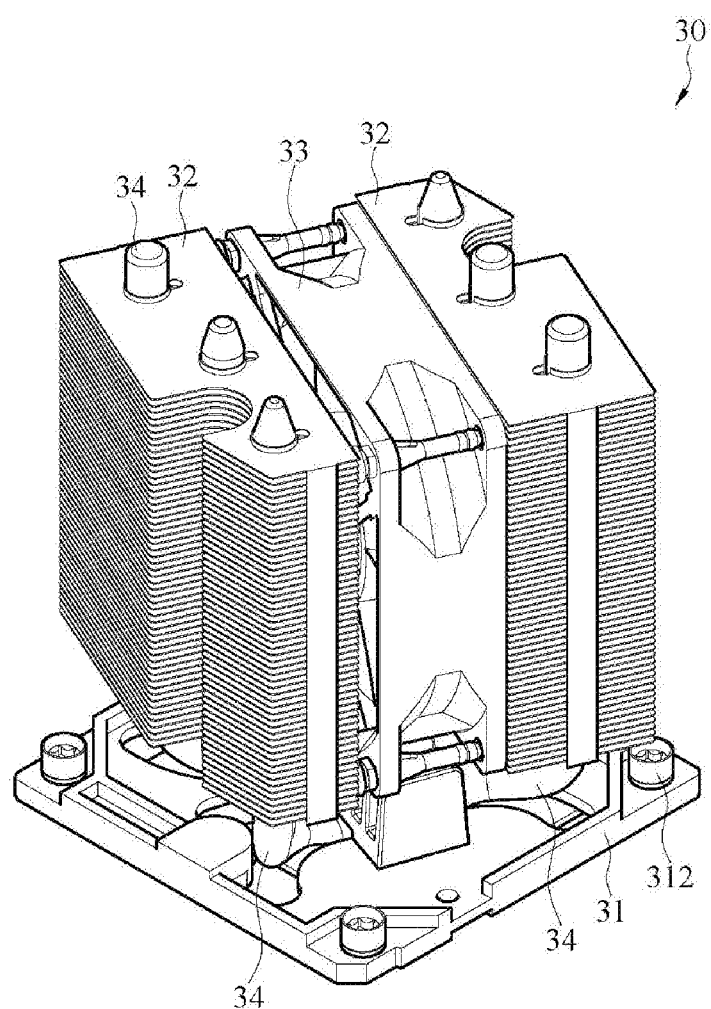
FIG. 1 is a schematic diagram of the heat dissipating device in an embodiment.
Figure 2:
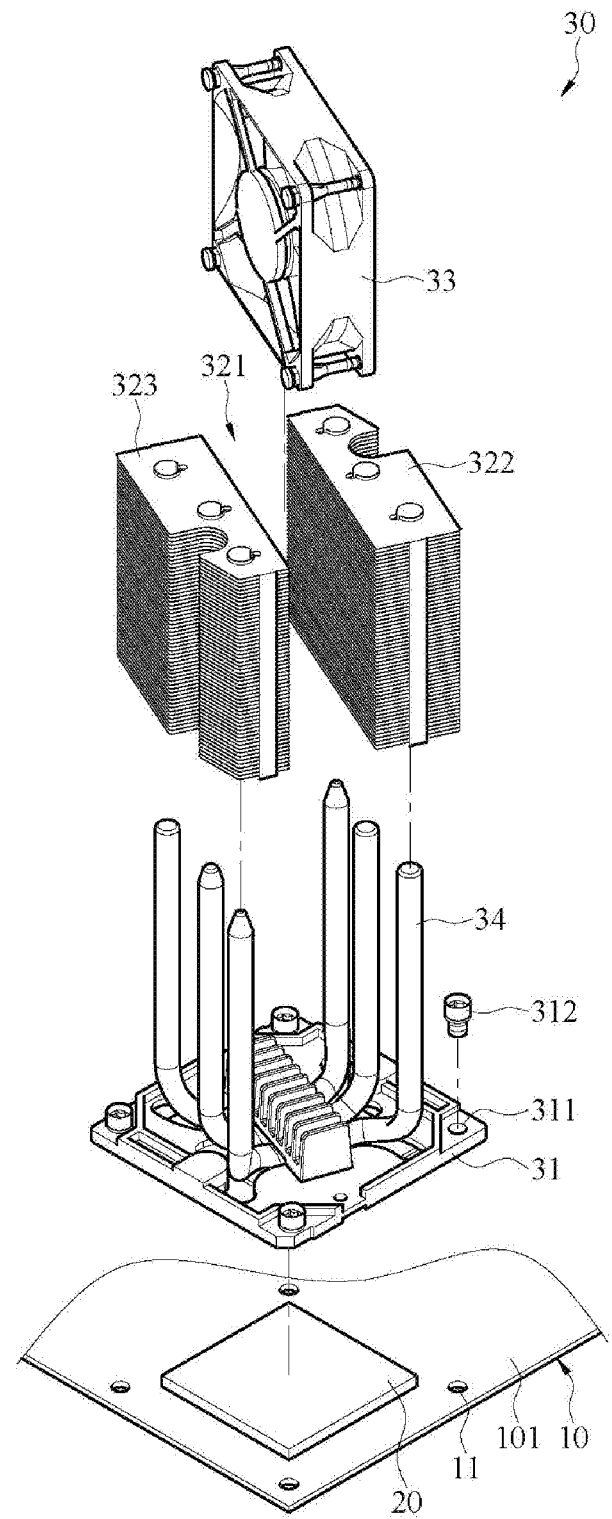
FIG. 2 is an exploded view of the heat dissipating device in an embodiment.

Referring to FIG. 1 and FIG. 2, a circuit board 10 is provided, which includes a configuration surface 101, a heat element 20, and a heat dissipating device 30. The heat element 20 is disposed on the configuration surface 101. The heat dissipating device 30 disposed on the heat element 20 contacts the heat element 20 for dissipating heat of the heat element 20.

In an embodiment, the heat element 20 is at least one of a processor (CPU), a north bridge chip, a south bridge chip, or other components that generate heat while operation, which is not limited herein. Wherein, following embodiments are illustrated by the processor as an example.

The heat dissipating device 30 includes a base 31, a fin set 32, and a fan assembly 33. The fin set 32 is mounted on the base 31 and the fan assembly 33 is located in the fin set 32. A bottom surface of the base 31 contacts the heat element 20. The other side of the base 31 opposite the bottom surface is for fixing the fin set 32. That is, the heat element 20 has a heat generating surface corresponding to the bottom surface of the base 31, and the heat surface of the heat element 20 contacts the bottom surface of the base 31. The base 31 has a plurality of fixing holes 311, the fixing holes 311 are located at the periphery of the base 31. Each of the fixing holes 311 is a screw hole 11 for screws 312 (or bolts) to be threaded and fixed to the circuit board 10. Thereby, the base 31 is in close contact with the heat element 20, and the heat dissipating device 30 is fixed on the configuration surface 101 of the circuit board 10.

Figure 3:
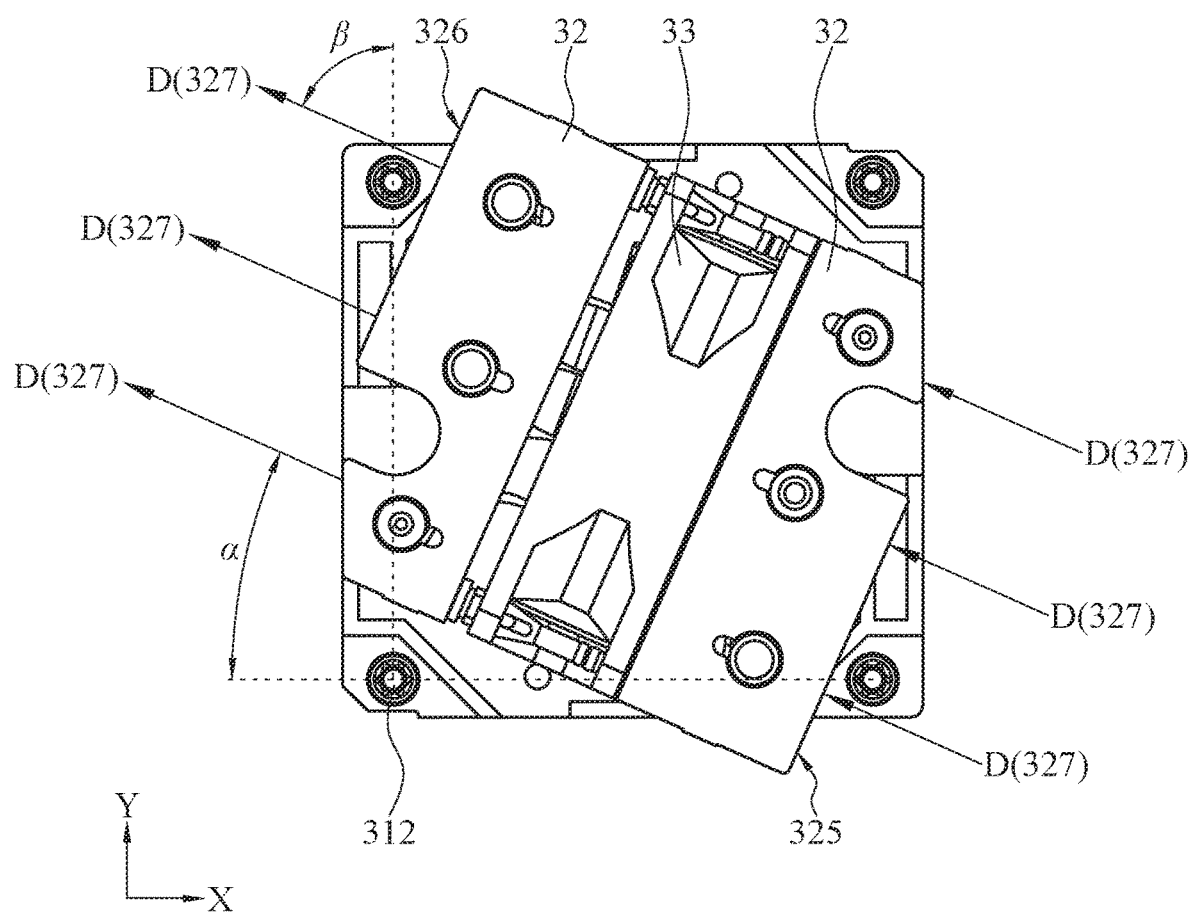
FIG. 3 is a top view of the heat dissipating device in an embodiment.

In an embodiment, referring to FIG. 2 and FIG. 3, the base 31 is substantially rectangular, and each of the fixing holes 311 is disposed adjacent to the periphery of the base 31. And the connecting lines between the fixing holes 311 and the adjacent fixing holes 311 are respectively defined as connecting line directions. In one embodiment, each of the fixing holes 311 is individually located at corners of the base 31. In other words, the base 31 is a rectangle, and each of the fixing holes 311 is located at a corner between the sides and the sides. In this embodiment, the connecting lines of the fixing holes 311 in the direction X of FIG. 3 is referred to as a first connecting line direction. The connecting lines of the fixing holes 311 in the direction Y of FIG. 3 is referred to as a second connecting line direction.

In an embodiment, the fin set 32 is formed by a plurality of fins, and the fin set 32 has a receiving slot 321. The receiving slot 321 is configured to accommodate the fan assembly 33. In the embodiment, fins are disposed on opposite sides of the fin set 32 to form a first fin group 322 and a second fin group 323, and the receiving slot 321 is formed between the first fin group 322 and the second fin group.

Figure 4:
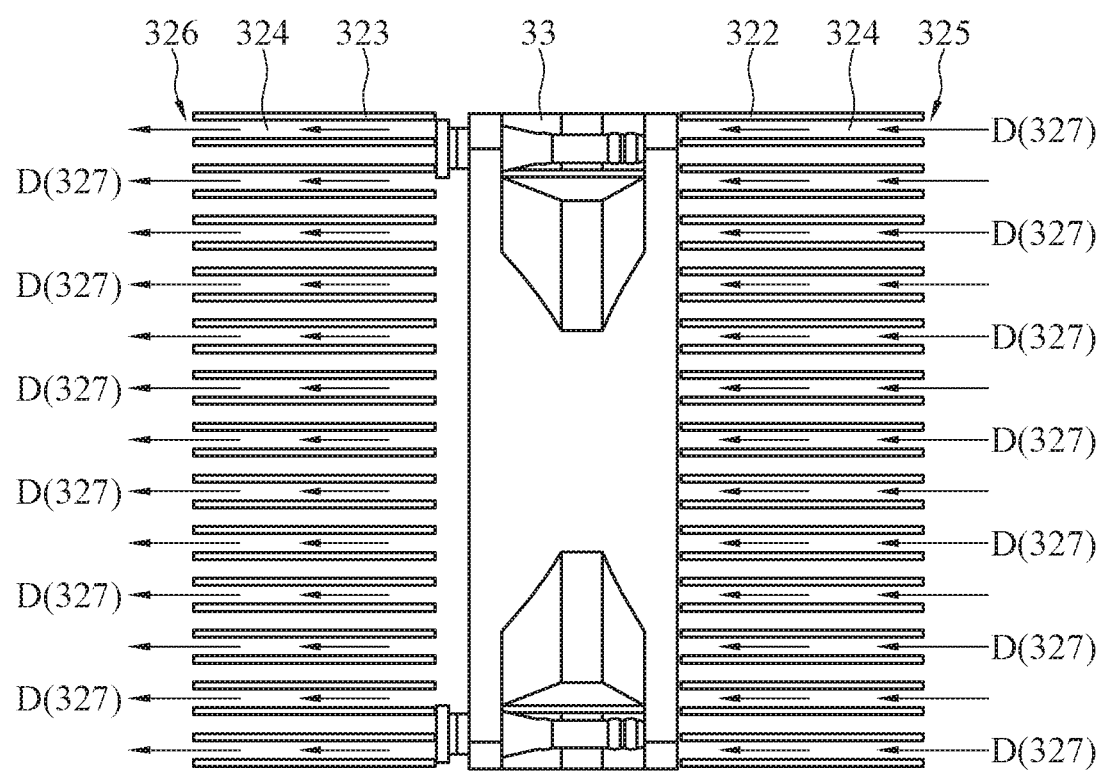
FIG. 4 is a side view of the heat dissipating device in an embodiment.

Referring to FIG. 4, the fin set 32 has at least one airflow channel 324. In this embodiment, the fin set 32 forms a plurality of airflow channels 324 by a plurality of fins, and each of the airflow channels 324 has inlet 325 and outlet 326. The inlet 325 and the outlet 326 are opposite to each other. The fan assembly 33 is located in the airflow channels 324. The airflow is generated by operation of the fan assembly 33. And the airflow flows from the inlet 325 of the airflow channel 324 to the outlet 326 of the airflow channel 324. In other words, the fins of the fin set 32 form the airflow channel 324 which allowing the airflow to flow. The vertical projection of a direction 327 of the airflow channel 324 on the base 31 and the vertical projection of the connecting line directions (e.g., the first connecting line direction or the second connecting line direction) between each two adjacent fixing holes 311 (or each two adjacent screws) on the base 31 are non-orthogonal and non-parallel. In other words, an angle exists between the vertical projection of the direction 327 of the airflow channels 324 on the base 31 and the vertical projection of the connecting line direction on the base 31.

In one embodiment, each of the fins is a horizontally disposed on the base 31 as shown in FIG. 1 and FIG. 2, which is not limited herein. In other embodiment, the fins are vertically disposed on the base 31 (not shown).

Referring to FIG. 3, in an embodiment, the non-orthogonal and non-parallel described above indicates that an angle exists between the vertical projection of the direction 327 of the airflow channels 324 on the base 31 and the vertical projection of the first connecting line direction on the base 31 (as shown in FIG. 3). Similarly, an angle β exists between the vertical projection of the direction 327 of the airflow channels 32 on the base 31 4 and the vertical projection of the second connecting line direction on the base 31. In an embodiment, the angle α is greater than 0 degrees and less than 90 degrees. In an embodiment, the angle β is greater than 0 degrees and less than 90 degrees. In one embodiment, the vertical projection of the direction 327 on the base 31 is non-orthogonal and non-parallel to any side of the base 31. That is, the airflow blown by the fan assembly 33 flows out from the outlet 326 of the airflow channel 324, and the vertical projection of the airflow direction on the base 31 is non-orthogonal and non-parallel to any side of the base 31. In other words, the angle between the vertical projection of the airflow from the outlet 326 on the base 31 and any side of the base 31 is greater than 0 degrees and less than 90 degrees.

Figure 5:
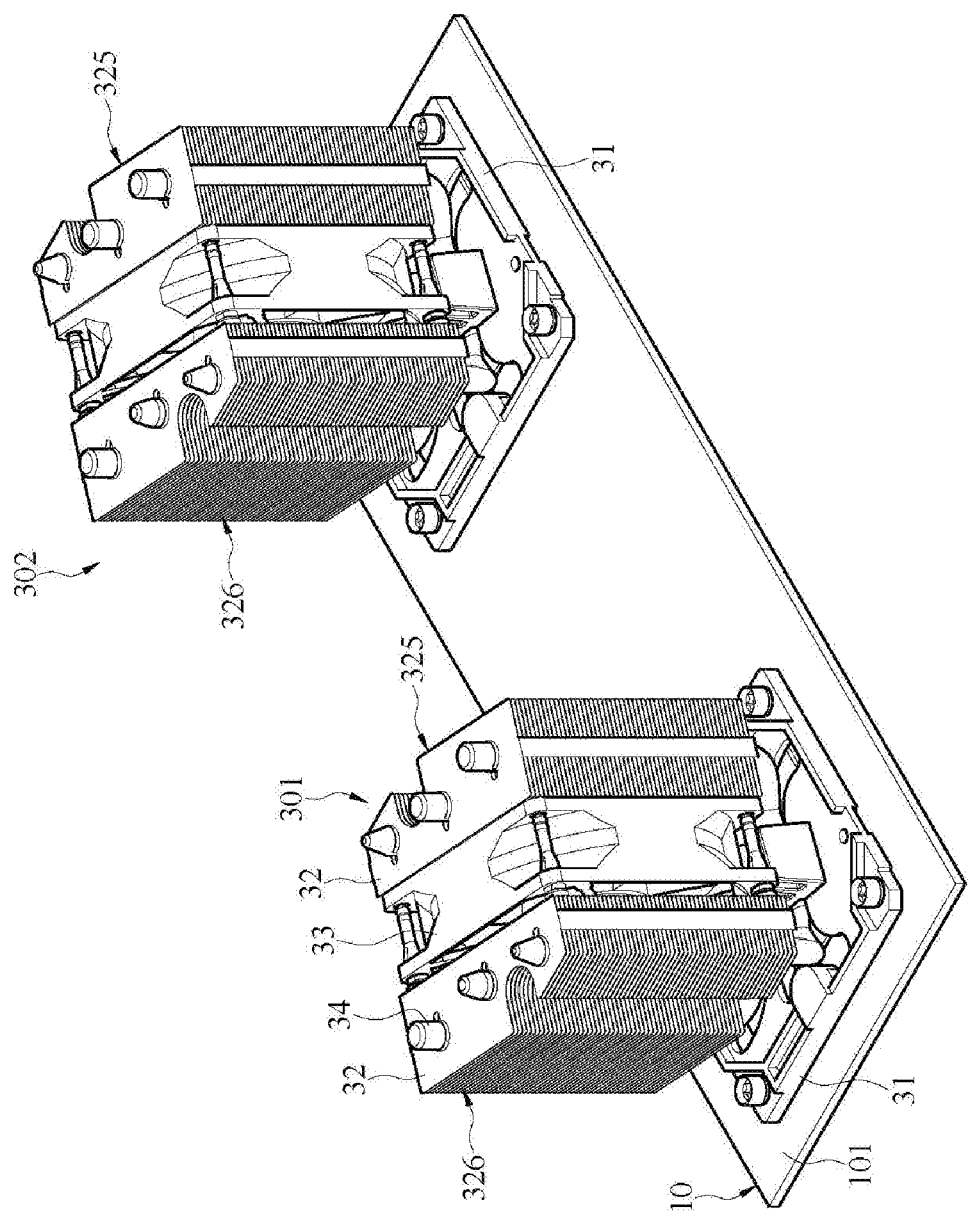
FIG. 5 is an exploded view of the heat dissipating device in another embodiment.
Figure 6:
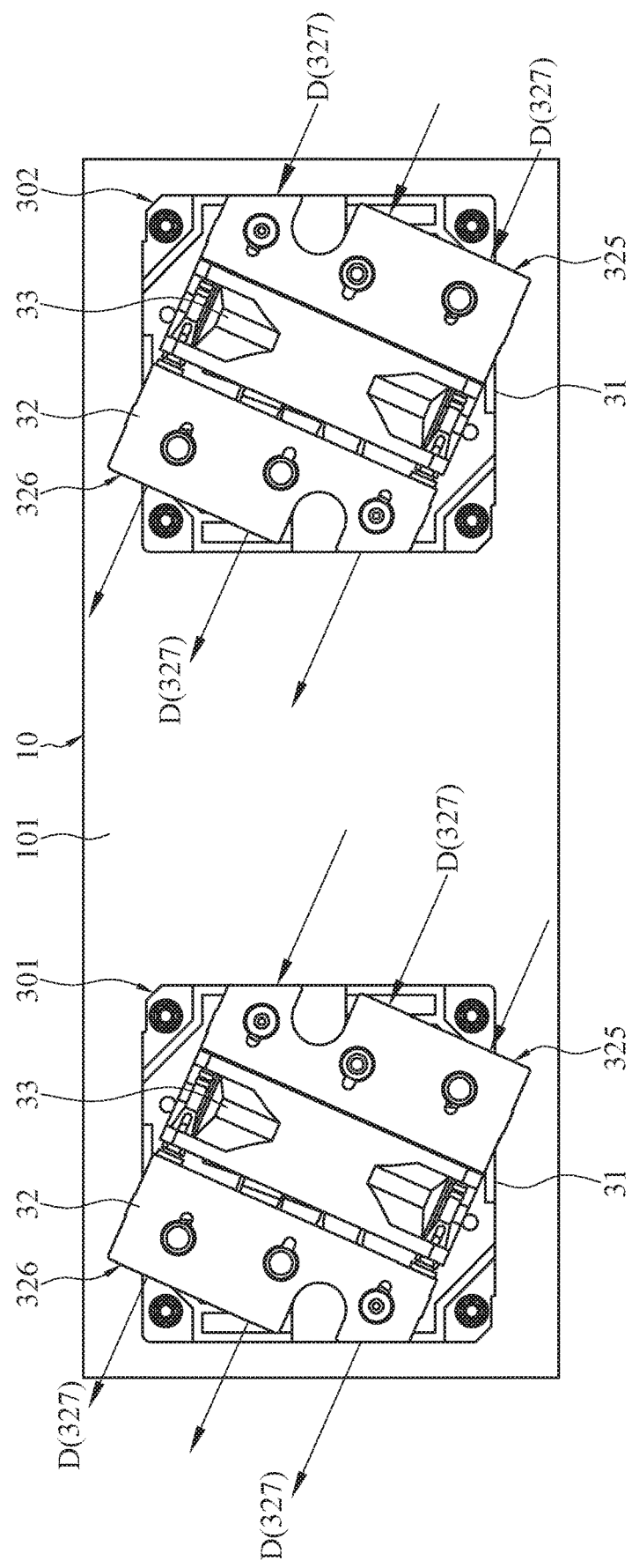
FIG. 6 is a plan view of the heat dissipating device in another embodiment.

Referring to FIG. 5 and FIG. 6, in an embodiment, the circuit board 10 includes two heat elements 20 (such as the design of the dual processors) on the configuration surface 101, and the heat dissipating device 30 is disposed at each of the heat elements 20 and contacting each heat element 20. The heat dissipating devices 30 includes a first heat dissipating device 301 and a second heat dissipating device 302. The inlet 325 of the airflow channel 324 of the first heat dissipating device 301 is located on the side of the first heat dissipating device 301 adjacent to the second heat dissipating device 302, and the outlet 326 of the airflow channel 324 of the second heat dissipating device 302 is located on the side of the second heat dissipating device 302 adjacent to the first heat dissipating device 301. The inlet 325 of the airflow channel 324 of the first heat dissipating device 301 and the outlet 326 of the airflow channel 324 of the second heat dissipating device 302 are misaligned with each other.

Therefore, the airflow direction of the airflow flowing out from the outlet 326 of any one of the heat dissipating devices 300 does not face the other heat dissipating device 30. That is, the second airflow of the heat dissipating device 302 does not flow to the first heat dissipating device 301. Since the inlet 325 of the first heat dissipating device 301 does not inhale the airflow from the outlet 326 of the second heat dissipating device 302, the inlet 325 of each heat dissipating device 30 is inhaling cold air, that improves the heat dissipation efficiency of each heat dissipating device 30, therefore, the overall heat dissipation efficiency is greatly improved.

Referring back to FIG. 1 and FIG. 2, the heat dissipating device 30 includes a heat pipe assembly 34 disposed on the base 31 and passing through the through hole of the fin set 32. Therefore, the heat pipe assembly 34 quickly transmits the heat energy, absorbed by the base 31 from the heat element 20, to the fins of the fin set 32 to improve heat dissipation efficiency.

Figure 7:
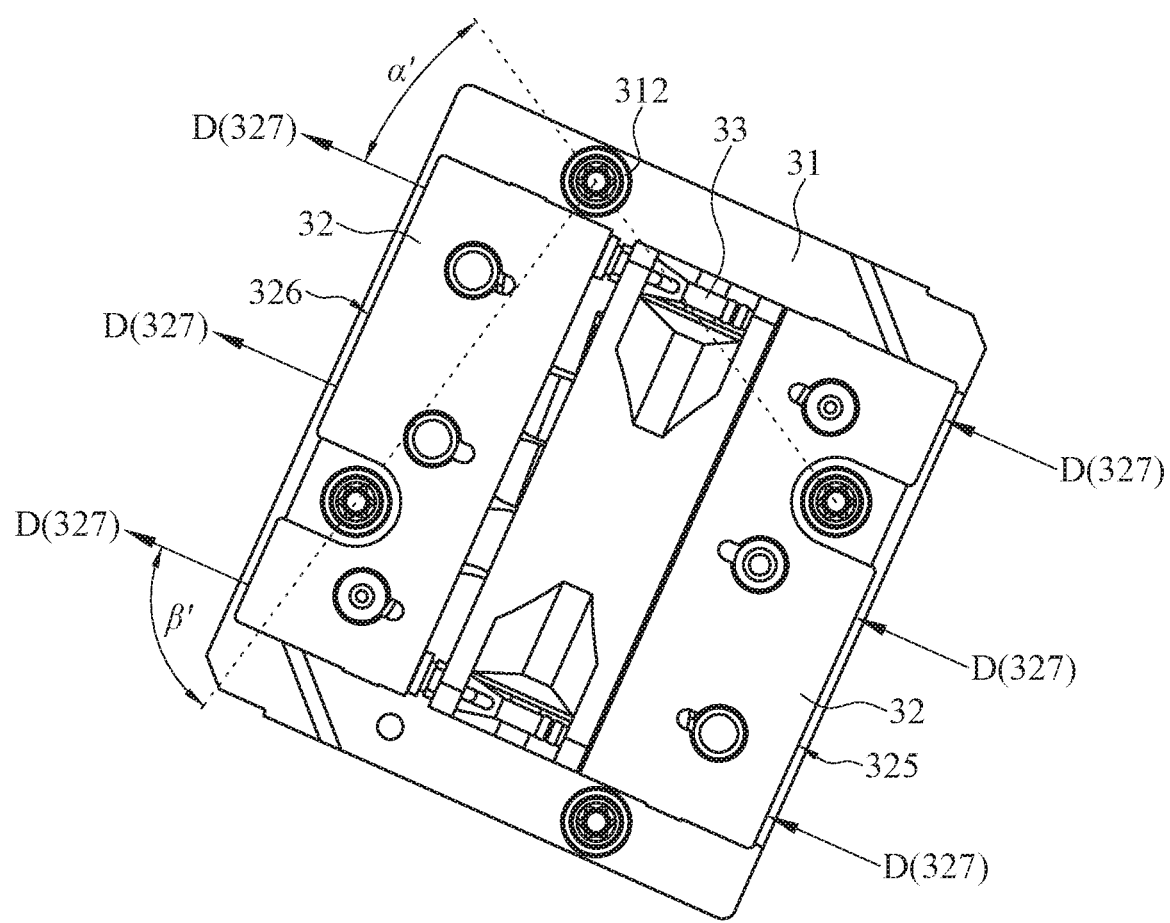
FIG. 7 is a plan view of the heat dissipating device in another embodiment.

Referring to FIG. 7, in an embodiment, the fixing holes 311 of the base 31 are respectively disposed on sides of the base 31. In other words, the base 31 is a rectangle, and each of the fixing holes 311(312) is located on the side between the two corners. In this embodiment, the connecting line direction between each two adjacent fixing holes 311 is referred as the third connecting line direction or the fourth connecting line direction. Similar to the foregoing embodiments, the airflow flows through the inlet 325 of the airflow channel 324 by the operation of the fan assembly 33, and flows out form the outlet 326 of the airflow channel 324. The vertical projection of the direction 327 of the airflow channel 324 on the base 31 and the vertical projection of the connecting line direction (e.g., the third connecting line direction or the fourth connecting line direction) between each two adjacent fixing holes 311 (or each two adjacent screws) on the base 31 are non-orthogonal and non-parallel.

Herein, an angle α' exists between the vertical projection of the direction 327 of the airflow channel 324 on the base 31 and the vertical projection of the third connecting line direction on the base 31, and an angle (3' exists between the vertical projection of the direction 327 on the base 31 and the vertical projection of the fourth connecting line direction on the base 31. In an embodiment, the angle α' is greater than 0 degrees and less than 90 degrees. In an embodiment, the angle β' is greater than 0 degrees and less than 90 degrees.

According to the above embodiment, the airflow channels of the heat dissipating devices 30 are misaligned with each other, so that the airflow flowing out does not flow to the other heat dissipating devices 30. Thus, the heat dissipating device 30 can be prevented from inhaling heat airflow. It allows the heat dissipating device to inhale more cold air to improve overall heat dissipation efficiency.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A heat dissipating device for dissipating heat of a heat element, the heat dissipating device comprises:
  a base, having a plurality of fixing holes, each of the fixing holes is disposed adjacent to a periphery of the base, a connecting direction is respectively defined according to a connecting line between each two adjacent of the plurality of fixing holes;

a fin set, disposed on the base and having at least one airflow channel;

a heat pipe assembly disposed on the base and passing through the fin set and a fan assembly, disposed in the fin set to generate an airflow that flows through the at least one airflow channel, wherein the direction of the at least one airflow channel and the connecting line direction are non-orthogonal and non-parallel in a top view of the heat dissipating device.

2. The heat dissipating device according to claim 1, wherein the base is a rectangle, and the fixing holes are individually located at corners of the base.

3. The heat dissipating device according to claim 1, wherein the base is a rectangle, and the fixing holes are individually located on sides of the base.

4. A circuit board, comprising:

a configuration surface;

at least two heat elements, disposed on the configuration surface; and at least two heat dissipating devices, respectively disposed on the at least two heat elements, and respectively having at least one airflow channel, wherein the direction of the at least one airflow channel of each of the at least two heat dissipating devices are misaligned with each other;

wherein each of the two heat dissipating devices comprises:

a base, having a plurality of fixing holes, each of the fixing holes is disposed adjacent to a periphery of the base, each connecting line direction respectively defined according to a connecting line between each two of adjacent of the plurality of fixing holes;

a fin set, disposed on the base and having at least one airflow channel; and a fan assembly, disposed in the fin set to generate an airflow flows through the at least one airflow channel;

wherein the direction of the at least one airflow channel and the connecting line direction are non-orthogonal and non-parallel in a top view of the heat dissipating device.

5. The circuit board according to claim 4, wherein the airflow channel has an inlet and an outlet, and the inlet and the outlet are opposite to each other, the fan assembly is disposed in the airflow channel, and the airflow flows from the inlet to the outlet.

6. The circuit board according to claim 5, wherein the two heat dissipating device includes devices include a first heat dissipating device and a second heat dissipating device, the inlet of the at least one airflow channel of the first heat dissipating device is located on a side of the first heat dissipating device adjacent to the second heat dissipating device, and the outlet of the at least one airflow channel of the second heat dissipating device is located on the side of the second heat dissipating device adjacent to the first heat dissipating device, the inlet of the at least one airflow channel of the first heat dissipating device and the outlet of the at least one airflow channel of the second heat dissipating device are misaligned with each other.

7. The circuit board according to claim 4, wherein the base is a rectangle, and the fixing holes are individually located at corners of the base.

8. The circuit board according to claim 4, wherein the base is a rectangle, and the fixing holes are individually located on sides of the base.

9. The circuit board according to claim 4, wherein the heat element is a processor.

* * * * *